(12) United States Patent
Jeong et al.

(10) Patent No.: US 10,421,123 B2
(45) Date of Patent: Sep. 24, 2019

(54) METAL/TWO-DIMENSIONAL NANOMATERIAL HYBRID CONDUCTIVE FILM AND METHOD FOR MANUFACTURING SAME

(71) Applicant: Korea Electrotechnology Research Institute, Changwon-si, Gyeongsangnam-do (KR)

(72) Inventors: Hee Jin Jeong, Changwon-si (KR); Geon Woong Lee, Changwon-si (KR); Ho Young Kim, Changwon-si (KR); Kang Jun Baeg, Changwon-si (KR); Seung Yol Jeong, Gimhae-si (KR); Joong Tark Han, Changwon-si (KR)

(73) Assignee: Korea Electrotechnology Research Institute (KR)

( * ) Notice: Subject to any disclaimer, the term of this patent is extended or adjusted under 35 U.S.C. 154(b) by 0 days.

(21) Appl. No.: 15/848,322

(22) Filed: Dec. 20, 2017

(65) Prior Publication Data
US 2018/0133794 A1 May 17, 2018

Related U.S. Application Data

(63) Continuation of application No. PCT/KR2016/005845, filed on Jun. 2, 2016.

(30) Foreign Application Priority Data

Jun. 22, 2015 (KR) .......................... 10-2015-0088493
May 31, 2016 (KR) .......................... 10-2016-0067042

(51) Int. Cl.
*B22F 3/10* (2006.01)
*C09D 11/52* (2014.01)
(Continued)

(52) U.S. Cl.
CPC .............. *B22F 3/10* (2013.01); *B22F 1/0022* (2013.01); *B22F 1/0074* (2013.01); *B22F 1/02* (2013.01);
(Continued)

(58) Field of Classification Search
CPC .... B22F 3/10; H01L 21/324; H01L 23/53228; H01B 1/22; C09D 11/52
See application file for complete search history.

(56) References Cited

U.S. PATENT DOCUMENTS 9,114,405 B2 * 8/2015 Green ...................... B03D 3/00
9,876,131 B2 * 1/2018 Lee ................... H01L 31/03845
(Continued)

FOREIGN PATENT DOCUMENTS

KR          10-0775077 B1     11/2007
KR    10-2008-0027716 A        3/2008
(Continued)

OTHER PUBLICATIONS

Park et al., "Synthesis of Cu2SnS3 and Cu2ZnSnS4 nanoparticles with tunable Zn/Sn ratios under multibubble sonoluminescence conditions", Dalton Transactions, 2013, vol. 42, pp. 10545-10550; 6 pages.*
(Continued)

*Primary Examiner* — William Coleman
(74) *Attorney, Agent, or Firm* — Park & Associates IP Law, P.C.

(57) ABSTRACT

A method for manufacturing a conductive film, the method comprising the steps of: preparing a mixture liquid in which a catalytic metal is dispersed in a precursor or a precursor compound of a two-dimensional nanomaterial; and forming a catalytic metal/two-dimensional nanomaterial by irradiating the mixture liquid with ultrasonic waves to generate microbubbles, degrading the precursor compound using
(Continued)

energy, which is generated when the microbubbles burst, to synthesize the two-dimensional nanomaterial on an outer wall of the catalytic metal, wherein the method further comprises: dispersing the catalytic metal/two-dimensional nanomaterial in a dispersion to prepare ink; and applying the ink on a substrate and performing rapid air-sintering. Thus, the two-dimensional nanomaterial is synthesized on an outer wall of a non-noble metal having high oxidative characteristics, thereby preventing oxidation of the metal from air and increasing thermal conductivity and electrical conductivity.

13 Claims, 8 Drawing Sheets

(51) Int. Cl.
    *H01B 1/22*     (2006.01)
    *H01L 21/324*     (2006.01)
    *H01L 23/532*     (2006.01)
    *H01L 23/498*     (2006.01)
    *B22F 1/00*     (2006.01)
    *B22F 1/02*     (2006.01)
    *B22F 7/04*     (2006.01)
    *B22F 9/30*     (2006.01)

(52) U.S. Cl.
    CPC ............... *B22F 7/04* (2013.01); *C09D 11/52* (2013.01); *H01B 1/22* (2013.01); *H01L 21/324* (2013.01); *H01L 23/49883* (2013.01); *H01L 23/53228* (2013.01); *B22F 9/30* (2013.01); *B22F 2007/047* (2013.01); *B22F 2998/10* (2013.01); *B22F 2999/00* (2013.01)

(56) References Cited

U.S. PATENT DOCUMENTS

| | | | |
|---|---|---|---|
| 9,890,043 B2* | 2/2018 | Hersam | C01B 32/196 |
| 2008/0237028 A1* | 10/2008 | Kislev | A61B 8/481 |
| | | | 204/157.15 |
| 2014/0212672 A1* | 7/2014 | Han | H01B 1/22 |
| | | | 428/408 |
| 2015/0004329 A1* | 1/2015 | Abuhimd | C25F 3/22 |
| | | | 427/551 |
| 2015/0315404 A1* | 11/2015 | Sun | C09D 5/18 |
| | | | 427/487 |
| 2016/0361714 A1* | 12/2016 | Chiang | B01J 21/18 |
| 2017/0113934 A1* | 4/2017 | Kowalewski | C01B 32/184 |
| 2017/0216923 A1* | 8/2017 | Babenko | B01J 35/0006 |
| 2017/0253824 A1* | 9/2017 | Huh | B01J 27/051 |
| 2017/0275180 A1* | 9/2017 | Liu | C01G 41/00 |

FOREIGN PATENT DOCUMENTS

| | | |
|---|---|---|
| KR | 10-2011-0123214 A | 11/2011 |
| KR | 10-1088723 B1 | 12/2011 |
| KR | 10-2012-0103947 A | 9/2012 |
| KR | 10-2013-0021151 A | 3/2013 |
| KR | 10-1418276 B1 | 7/2014 |

OTHER PUBLICATIONS

International Search Report (PCT/KR2016/005845), WIPO, dated Sep. 22, 2016.

* cited by examiner

METAL/TWO-DIMENSIONAL NANOMATERIAL HYBRID CONDUCTIVE FILM AND METHOD FOR MANUFACTURING SAME

REFERENCE TO RELATED APPLICATIONS

This is a continuation of pending International patent application Ser. No. PCT/KR2016/005845 filed on Jun. 2, 2016, which designates the United States and claims priority of Korean Patent Application No. 10-2015-0088493 filed on Jun. 22, 2015, and Korean Patent Application No. 10-2016-0067042 filed on May 31, 2016, the entire contents of which are incorporated herein by reference.

FIELD OF THE INVENTION

The present invention relates to a metal/two-dimensional nanomaterial hybrid conductive film and a method for manufacturing the same. More particularly, the present invention relates to a metal/two-dimensional nanomaterial hybrid conductive film and a method for manufacturing the same, in which the metal/two-dimensional nanomaterial hybrid conductive film is manufactured by synthesizing a two-dimensional nanomaterial on an outer wall of non-noble metal having high oxidative characteristics, thereby preventing the oxidation of the metal by air and increasing thermal conductivity and electrical conductivity of the film.

BACKGROUND OF THE INVENTION

Nanoparticles have unique physical properties unlike properties of bulk and atomic species, and various studies of nanomaterials have been increasingly conducted around the world. An application of nanomaterials to various fields such as electrochemistry, microelectronics, optics, bionics, etc. has been on the rise since nanomaterials have unique physical properties. Particularly in electronic applications, various substrates are applied to manufacture electronics parts recently. Accordingly, a nanomaterial is needed for forming fine wiring on a thin film by various printing methods. In general, lithography is used for printing a pattern on a substrate but the complicated process increases the process price. Therefore, an electrically conductive metal ink capable of being printed as a pattern on a film directly without a complicated process is urgently needed.

Furthermore, in addition to formation of fine wiring, inclusion of a heat integration phenomenon has been intensified in the electronic industry due to miniaturization and high power output of electric/electronic components and integration of electronic components, such that interest has increased in high heat dissipation materials for preventing malfunction of electronic component due to heat integration. In particular, the heat dissipation body is composed of semiconductor components such as power transistor, thermistor, printed wiring board, and integrated circuit (IC), etc. and also electric/electronic components such as heat dissipation material containing epoxy resin and inorganic filler. Such heat dissipation materials are required to have superior strength and thermal conductivity.

Thermal conductive and electrical conductive ink materials mainly used in the industry are noble metals such as silver (Ag), gold (Au), platinum (Pt), etc. which have high thermal conductivity, electrical conductivity, and low degree of oxidation, whereby it is known that noble metals are capable of being applied to printing process directly. However, noble metals have limit in manufacture of ultra-fine wiring circuit due to high price and ion migration phenomenon. Non-noble metals such as copper (Cu), nickel (Ni), aluminum (Al), etc. having similar thermal conductivity and electrical conductivity of noble metals are used to solve such problems since non-noble metals enable designing a ultra-fine wiring and are cheaper than noble metals. Despite of such merits of non-noble metals, manufacturing cost is increased due to high degree of oxidation thereof, so commercialization of noble metals is difficult.

A step of sintering a substrate, in addition to prevention of surface oxidation, is also one of processes to be solved in a method of manufacturing a conductive film. A conductive ink containing metal particles is subjected to a sintering process in which conductivity is imparted through a connection between metal particles by using heat or light energy after being printed on an insulating substrate. Noble metal based-conductive ink having a low degree of oxidation can be sintered under atmosphere generally, while non-noble metal-based ink having high degree of oxidation is needed to be sintered under an inert gas atmosphere, a hydrogen gas atmosphere, or vacuum. A related art is known in Korea Patent No. 10-1418276, entitled "Synthetic method of preventing metal nano-particle from having oxidized film and method of forming conductive metal thin film via solution-processed". The related art provides forming a conductive film by sintering under an argon and hydrogen atmosphere using a copper-based conductive ink provided with a surface oxidation prevention film thereon. However, when sintering is performed in such inert gas atmosphere, the manufacturing cost is increased compared with the process under the general atmosphere.

In addition, a related art known as Korea Patent No. 10-0775077, entitled "Positive polar materials and its manufacturing method of Li-secondary battery" provides that a stabilized oxide layer is additionally formed for prevention of oxidation. However, when the oxide layer is formed as described above, an additional process and material are needed so a manufacturing process becomes complicated and manufacturing cost is increased.

SUMMARY OF THE INVENTION

Accordingly, the present invention has been made keeping in mind the above problems occurring in the related art, and an object of the present invention is to provide a metal/two-dimensional nanomaterial hybrid conductive film and a method for manufacturing the same, in which the metal/two-dimensional nanomaterial hybrid conductive film is manufactured by synthesizing a two-dimensional nanomaterial on an outer wall of non-noble metal having high oxidative characteristics, thereby preventing the oxidation of the metal from air and increasing thermal conductivity and electrical conductivity of the film.

In addition, the present invention is to provide a metal/two-dimensional nanomaterial hybrid conductive film and a method for manufacturing the same, in which the metal/two-dimensional nanomaterial hybrid conductive film is manufactured by a rapid air-sintering which can be performed by using light energy due to the two-dimensional nanomaterial having an excellent absorption property of light energy such as microwave, and through the rapid air-sintering, the oxidation of the metal can be minimized and the processing time can be shortened.

In order to accomplish the above object, a method for manufacturing a metal/two-dimensional nanomaterial hybrid conductive film according to the present invention includes: preparing a mixture liquid in which a catalytic metal is dispersed in a precursor or a precursor compound of a two-dimensional nanomaterial; and forming a catalytic metal/two-dimensional nanomaterial by irradiating ultrasonic waves onto the mixture liquid to generate microbubbles, degrading the precursor compound using energy generated when the microbubbles burst to synthesize the two-dimensional nanomaterial on an outer wall of the catalytic metal, wherein the method further includes: dispersing the catalytic metal/two-dimensional nanomaterial in a dispersion to prepare an ink; and applying the ink on a substrate to form a conductive film and sintering the conductive film rapidly in the atmosphere.

The sintering the conductive film rapidly in the atmosphere may be conducted by irradiating the substrate with high-energy light in the atmosphere and may be conducted by irradiating the substrate with light for 0.1 ms to 50 ms.

The applying the ink on the substrate to form the conductive film and sintering the conductive film rapidly in the atmosphere may be conducted by coating, patterning, extruding, blasting, spreading, or printing, and the ultrasonic waves may be generated by an electric power in a range of 100 W to 300 W.

In order to accomplish the above object, a metal/two-dimensional nanomaterial hybrid conductive film according to the present invention, wherein the conductive film includes: a substrate; and a hybrid particle layer formed on the substrate, the hybrid particle layer being made of a two-dimensional nanomaterial and surrounding a catalytic metal, which is a core, and an outer wall of the catalytic metal to form a shell shape.

The hybrid particle layer may be sintered rapidly in the atmosphere by irradiating the hybrid particle layer with high-energy light and the two-dimensional nanomaterial may include a material absorbing light and dissipating heat.

The two-dimensional nanomaterial may be selected from the group consisting of graphene, hexagonal boron nitride (h-Boron nitride), transition metal chalcogenide, and a mixture thereof, wherein the transition metal chalcogenide is expressed as $MX_2$, where M may be one selected from the group consisting of titanium (Ti), vanadium (V), zirconium (Zr), niobium (Nb), molybdenum (Mo), technetium (Tc), hafnium (Hf), tantalum (Ta), tungsten (W), and rhenium (Re), and X may be one selected from the group consisting of sulfur (S), selenium (Se), and tellurium (Te).

The catalytic metal may be selected from the group consisting of copper (Cu), nickel (Ni), cobalt (Co), iron (Fe), chromium (Cr), tungsten (W), platinum (Pt), palladium (Pd), aluminum (Al), which are non-noble metals, and an alloy thereof.

The hybrid particle layer may be formed by a method that the two-dimensional nanomaterial is synthesized on the outer wall of the catalytic metal by using a mixture liquid in which the catalytic metal is dispersed in a precursor or a precursor compound of the two-dimensional nanomaterial, and the catalytic metal is oxidized. Furthermore, the hybrid particle layer may be formed by a method where the mixture liquid is irradiated with ultrasonic waves to generate microbubbles and the precursor compound is degraded by using an energy generated when the microbubbles burst to synthesize the two-dimensional nanomaterial on the outer wall of the catalytic metal.

According to the present invention having above-mentioned construction, a two-dimensional nanomaterial is synthesized on an outer wall of a non-noble metal having high oxidative characteristics, thereby preventing oxidation of the metal from air and increasing thermal conductivity and electrical conductivity of a film.

In addition, rapid air-sintering is performed using light energy by the two-dimensional nanomaterial having excellent light energy absorption, and through the rapid air-sintering, the oxidation of the metal is minimized and the processing time is shortened.

DETAILED DESCRIPTION OF THE INVENTION

Hereinafter, a metal/two-dimensional nanomaterial hybrid conductive film and a method for manufacturing the same according to embodiments of the present invention will be described with reference to the accompanying drawings.

A metal/two-dimensional nanomaterial hybrid conductive film includes a substrate and a hybrid particle layer formed on the substrate, the hybrid particle layer being made of a two-dimensional nanomaterial and surrounding a catalytic metal, which is a core, and an outer wall of the catalytic metal to form a shell shape. At this point, the metal/two-dimensional nanomaterial is a hybrid-shaped material which means that the metal is disposed at the core and the two-dimensional nanomaterial surrounds around the metal, which is the core, to form the shell shape.

Figure 1:
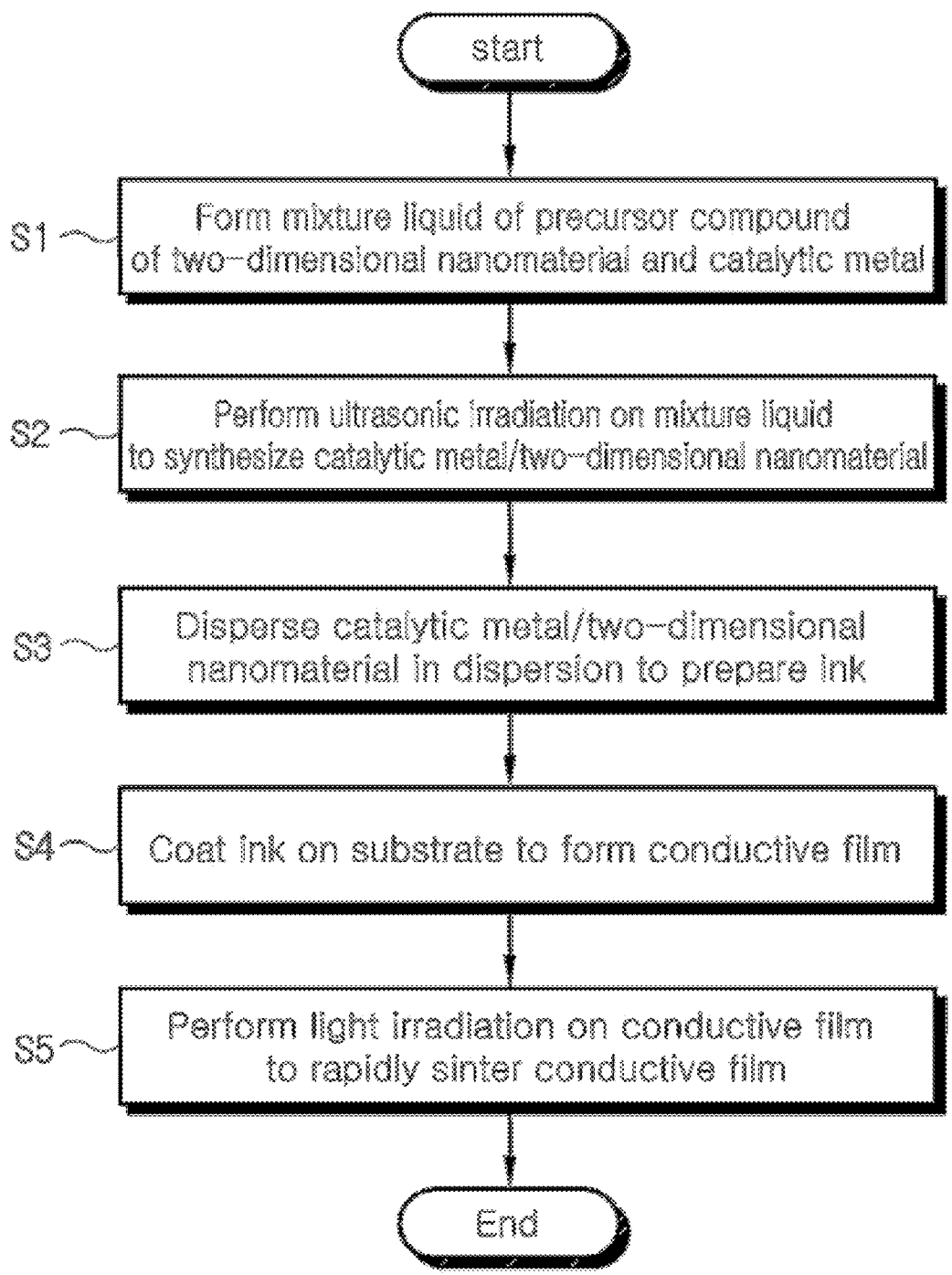
FIGS. 1 and 2 are flowcharts showing a manufacturing method of a metal/two-dimensional nanomaterial hybrid conductive film according to an embodiment of the present invention.
Figure 2:
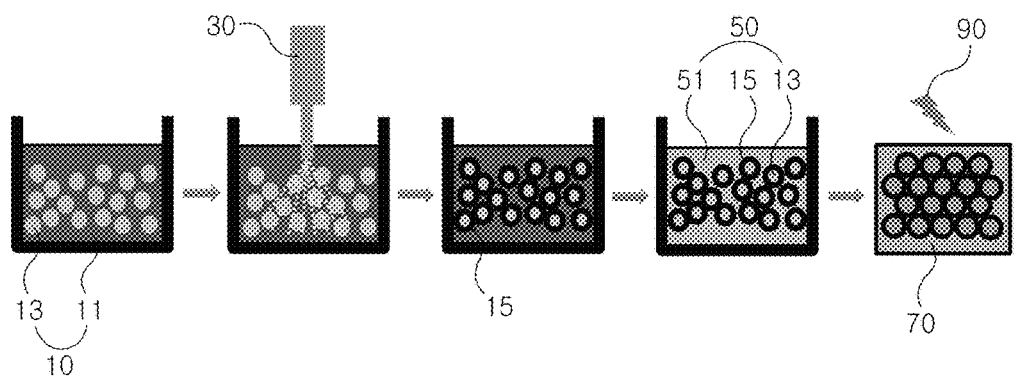

As described in FIGS. 1 and 2 for manufacturing such conductive film, a mixture liquid 10 in which a catalytic metal 13 is dispersed in a precursor or a precursor compound 11 of the two-dimensional nanomaterial is prepared (S1).

The catalytic metal 13 dispersed in the mixture liquid 10 absorbs atoms composing the two-dimensional nanomaterial 15 configured to be a shell structure and functions as a template for synthesis of the two-dimensional nanomaterial 15. Therefore, yield, crystallinity, and the number of layers of the synthesized two-dimensional nanomaterial 15 change according to purity and a type of the catalytic metal 13. As the purity of the catalytic metal 13 is high, it is easy to absorb the two-dimensional nanomaterial 15 surrounding the catalytic metal 13. Therefore, the manufacturing method may further include refining and deoxidizing the catalytic metal 13 according to circumstances before the catalytic metal 13 is put into the mixture liquid 10.

Here, the catalytic metal 13 configured to be the core structure means a non-noble metal having high thermal conductivity and electrical conductivity in atmosphere and oxidizing well. The catalytic metal 13 may be formed of one selected from the group consisting of copper (Cu), nickel (Ni), aluminum (Al), cobalt (Co), iron (Fe), chromium (Cr), tungsten (W), palladium (Pd), and an alloy thereof, or may be formed of at least one selected from the group consisting of an organic metal compound such as metallocene.

The precursor compound 11 of the two-dimensional nanomaterial 15 is a precursor synthesized to be the two-dimensional nanomaterial 15. In detail, the precursor compound 11 is synthesized to form the shell by surrounding the catalytic metal 13 to form the core with the two-dimensional nanomaterial 15. The synthesized two-dimensional nanomaterial 15 is synthesized by using one selected from the group consisting of graphene having high thermal conductivity and electrical conductivity, hexagonal boron nitride (h-boron nitride), transition metal chalcogenide, and a mixture thereof. Here, the transition metal chalcogenide is expressed as $MX_2$, where M is composed of one selected from the group consisting of titanium (Ti), vanadium (V), zirconium (Zr), niobium (Nb), molybdenum (Mo), technetium (Tc), hafnium (Hf), tantalum (Ta), tungsten (W), and rhenium (Re), and X is composed of one selected from the group consisting of sulfur (S), selenium (Se), and tellurium (Te).

The precursor compound 11 of the two-dimensional nanomaterial 15 is each precursor compound capable of synthesizing graphene having high thermal conductivity and electrical conductivity, h-boron nitride, and transition metal chalcogenide.

Here, a precursor compound 11 for synthesizing the graphene is a compound including carbon and may be selected from the group consisting of an organic solvent such as acetic acid, acetone, acetyl acetone, anisole, benzene, benzyl alcohol, butanol, butanone, chlorobenzene, chloroform, cyclohexane, cyclohexanol, cyclohexanone, butyl phthalate, dichloroethane, diethylene glycol, diglyme, dimethoxyethane, dimethyl phthalate, dioxane, ethanol, ethyl acetate, ethyl acetoacetate, ethyl benzoate, ethylene glycol, glycerin, heptane, heptanol, hexane, hexanol, methanol, methyl acetate, methylene chloride, octanol, pentane, pentanol, pentanone, tetrahydrofuran, toluene, and xylene, and a solvent dissolving organic monomer or organic polymer therein, and a mixture thereof, but is not limited to.

A precursor compound 11 for synthesizing the h-boron nitride is selected from the group consisting of borazine, ammonia borane, and a mixture thereof.

In addition, a precursor compound 11 for synthesizing the transition metal chalcogenide is selected from the group consisting of ammonium tetrathiomolybdate ($(NH_4)_2MoS_4$), molybdenum(V) chloride ($MoCl_5$), molybdenum trioxide ($MoO_3$), tungsten(VI) oxytetrachloride ($WOCl_4$), 1,2-ethanedithiol ($HS(CH_2)_2SH$), di-tert-butyl selenide ($C_8H_{18}Se$), diethyl selenide ($C_4H_{10}Se$), vanadium tetrakis(dimethylamide) ($V(NMe_2)_4$), tetrakis(dimethylamino)titanium (Ti$(NMe_2)_4$), 2-methyl propanethiol (Bu$^t$SH), tert-butyl disulfide (Bu$_2{}^tS_2$), and a mixture thereof.

In the mixture liquid 10 formed by the methods and materials, helium (He) gas or argon (Ar) gas was bubbled to control inside the solution to be an inert gas atmosphere. In case that an active gas exists in the mixture liquid 10, an undesired material may be synthesized or a part of the catalytic metal 13 may be oxidized when irradiating ultrasonic waves at following step. Therefore, to prevent such situation, an inert gas such as He gas or Ar gas is bubbled to remove all of active gases which may be present in the mixture liquid 10.

The mixture liquid 10 is irradiated with ultrasonic waves to synthesize catalytic metal 13/two-dimensional nanomaterial 15 (S2).

The mixture liquid 10 formed by dispersing the catalytic metal 13 in the precursor or in the precursor compound 11 is irradiated with ultrasonic waves by an ultrasonic irradiator 30 to generate microbubbles. When ultrasonic irradiation is performed continuously, a size of the microbubbles become large and an internal pressure of the microbubbles increase, so the microbubbles burst. At this point, generated local energy is above 5000° C. and causes decomposition of the precursor compound 11 existing around the microbubbles. The precursor compound 11 degraded by an energy generated when the microbubbles burst adsorbs to surround the outer wall of the catalytic metal 13 functioning as catalyst, thereby the core of the two-dimensional nanomaterial 15 is formed. Then, the core of the two-dimensional nanomaterial 15 is enlarged through continuous decomposition of the precursor compound 11 and such adsorption process, so catalytic metal 13/two-dimensional nanomaterial 15 hybrid particle including complete two-dimensional nanomaterial 15 is synthesized. The catalytic metal 13/two-dimensional nanomaterial 15 includes the nanosized catalytic metal 13 at the center region and the outer wall of the catalytic metal 13 is configured to be a core/shell structure in which the two-dimensional nanomaterial 15 is synthesized. Here, the ultrasonic irradiator 30 used for generating ultrasonic waves may use electric power of 100 W to 200 W and may be performed for 10 seconds to 6 hours.

The catalytic metal 13 of the catalytic metal 13/two-dimensional nanomaterial 15-core/shell hybrid particle obtained by such method, in which the catalytic metal 13 is non-noble metal, is surrounded by the two-dimensional nanomaterial 15, thereby preventing the catalytic metal 13 from oxidizing in the atmosphere. Although the rapid air-sintering process is performed thereto, the thermal conductivity and electrical conductivity of the catalytic metal 13 has no change, so the properties of the catalytic metal 13 are maintained. In addition, the two-dimensional nanomaterial 15 having high thermal conductivity and electrical conductivity is also included in the catalytic metal 13/two-dimensional nanomaterial 15-core/shell hybrid particle, thereby obtaining much excellent thermal conductivity and electrical conductivity compared with using the catalytic metal 13 only.

According to circumstances, the method may further include a step separating the catalytic metal 13/two-dimensional nanomaterial 15 from the mixture liquid 10 after synthesizing the catalytic metal 13/two-dimensional nanomaterial 15. When a remaining catalytic metal 13 or precursor compound 11 not synthesized to the mixture liquid 10 exists, such remainder may be removed to obtain pure catalytic metal 13/two-dimensional nanomaterial 15. At the step, the catalytic metal 13/two-dimensional nanomaterial 15 is filtered and washed to remove remainders might exist, thereby obtaining the pure catalytic metal 13/two-dimensional nanomaterial 15.

The catalytic metal 13/two-dimensional nanomaterial 15 is dispersed in a dispersant 51 to prepare an ink 50 (S3).

The pure catalytic metal 13/two-dimensional nanomaterial 15 is dispersed to the dispersant 51 to prepare high conductivity ink 50. At this point, high conductivity means high thermal conductivity and high electrical conductivity. Preferably, the ink 50 includes 40 to 80 parts by weight of the catalytic metal 13/two-dimensional nanomaterial 15. When the catalytic metal 13/two-dimensional nanomaterial 15 is included less than 40 parts by weight, the electrical conductivity is decreased remarkably due to lack of the catalytic metal 13/two-dimensional nanomaterial 15. On the other hand, when the catalytic metal 13/two-dimensional nanomaterial 15 is included over 80 parts by weight, a dispersibility of the catalytic metal 13/two-dimensional nanomaterial 15 is decreased and not coated properly due to increased viscosity.

It is preferable that a solvent generally used for coating ink composition and polar or non-polar solvent having a boiling point between 150° C. to 300° C. is used is used for the dispersant 51. The dispersant 51 includes at least one compound selected from the group consisting of terpineol, ethyl cellosolve, butyl cellosolve, carbitol, butyl carbitol, and glycerol.

At the step manufacturing the ink 50, a binder for ink is further included in the ink 50 to increase viscosity and adhesion of the ink 50. In detail, the binder may be an organic or inorganic material and may be at least one selected from the group consisting of a cellulose-based resin such as methyl cellulose, ethyl cellulose, hydroxypropyl cellulose, hydroxypropyl methylcellulose, cellulose acetate butyrate, carboxymethyl cellulose, and hydroxyethyl cellulose, a polyurethane-based resin, an acrylic-based resin, and a silane coupling agent. Here, the silane coupling agent includes vinyl alkoxy silane, epoxy alkyl alkoxy silane, meta acryloxy alkyl alkoxy silane, mercapto alkyl alkoxy silane, amino alkyl alkoxy silane, and the like.

The ink 50 may include 0.5 to 5 parts by weight of the binder. When the binder is included less than 0.5 parts by weight, viscosity and adhesion are not much improved due to small amount of the binder, and when the binder is included over 5 parts by weight, the electrical conductivity is decreased remarkably.

The ink 50 is applied on a substrate 70 to form a conductive film (S4).

The ink 50 having high thermal conductivity and high electrical conductivity and including the catalytic metal 13/two-dimensional nanomaterial 15 is applied to the substrate 70, which is a thin film, to form the conductive film. Here, a plastic substrate having low absorption rate of light energy is used for the substrate 70. The plastic substrate is selected from the group consisting of polyethylene terephthalate, polyethylene naphthalate, polycarbonate, polyimide, and a mixture thereof.

When the ink 50 is applied to the substrate 70, the ink 50 may be applied to the whole substrate 70 or to a part of the substrate 70 by patterning, like an electrode pattern. Applying the ink 50 to the substrate 70 is performed by a method such as coating, patterning, extruding, blasting, spreading, printing, and so on.

The conductive film is irradiated with light 90 to sinter the conductive film rapidly in the atmosphere (S5).

The conductive film provided with printed electrode pattern or applied the ink on the whole surface of the substrate 70 is irradiated with light 90 to perform rapid air-sintering. When the conductive film is irradiated with light 90, the two-dimensional nanomaterial 15 of the catalytic metal 13/two-dimensional nanomaterial 15 hybrid particle absorbs light 90 and then is instantaneously heated to high temperature. When the catalytic metal 13/two-dimensional nanomaterial 15 is heated as described above, heat is conducted to surroundings so the conductive film is sintered at high temperature. At this point, the two-dimensional nanomaterial 15 surrounding the outer wall of the catalytic metal 13 prevents the catalytic metal 13, which is non-noble metal, from contacting with air, thereby preventing oxidation during sintering process. Since a surface of the catalytic metal 13 is surrounded by the two-dimensional nanomaterial 15, performing general heat sintering method is acceptable instead of performing the light sintering method according to circumstances.

When sintering the conductive film by using high-energy light 90, the film is irradiated for a short time as 0.1 ms to 50 ms using the high-energy light 90. When irradiating the conductive film for such short time, the catalytic metal 13/two-dimensional nanomaterial 15 is heated at high temperature instantaneously but sintering the substrate 70 is completed before the temperature thereof is increased, thereby preventing deformation of the substrate 70. When irradiating light 90 for less than 0.1 ms, sintering is difficult to achieve. When irradiating light 90 for over 50 ms, the catalytic metal 13 oxidizes and the conductive film may be damaged due to increased temperature.

Here, ultraviolet rays, visible rays, infrared rays, microwaves, and so on may be used as light 90 and light 90 is an electromagnetic wave which is absorbed to the catalytic metal 13/two-dimensional nanomaterial 15 excellently.

Hereinbelow, an embodiment of the present invention will be described in detail.

Example 1

1-1. Preparing a Copper/Graphene Hybrid Ink 5 g of copper particle powder from which a surface oxide film was removed was added to 250 ml of xylene and graphene was synthesized on a surface of the copper particle using ultrasonic irradiation chemical method to form hybrid particle having a core/shell structure composed of the copper/graphene. Thereafter, a remaining xylene was removed through filtration and washing and an ink was prepared by dispersing the copper/graphene particle in dimethylformamide (DMF). In addition, ethyl cellulose and terpineol were added and stirred in order to obtain a high viscosity ink.

1-2. Manufacturing a Copper/Graphene Hybrid Conductive Film

The high viscosity ink prepared in step 1-1 was printed on an upper surface of a polyimide insulating film substrate having an area of 2×2 $cm^2$ by screen printing method to manufacture a copper/graphene hybrid conductive film. And the substrate coated with the ink was then dried in a furnace at 150° C.

1-3. Sintering the Copper/Graphene Hybrid Conductive Film

The conductive film was sintered by irradiating onto the substrate including the copper/graphene hybrid conductive film prepared in step 1-2 with a microwave of 1.8 kW for 10 ms.

Example 2

2-1. Preparing a Nickel/Graphene Hybrid Ink 5 g of nickel particle powder from which a surface oxide film was removed was added to 500 ml of xylene and graphene was synthesized on a surface of the nickel particle using ultrasonic irradiation chemical method to form hybrid particle having a core/shell structure composed of the nickel/graphene. Thereafter, a remaining xylene was removed through filtration and washing and an ink was prepared by dispersing the nickel/graphene particle in DMF. In addition, ethyl cellulose and terpineol were added and stirred in order to obtain a high viscosity ink.

2-2. Manufacturing a Nickel/Graphene Hybrid Conductive Film

The high viscosity ink prepared in step 2-1 was printed on an upper surface of a polyimide insulating film substrate having an area of 2×2 cm$^2$ by screen printing method to manufacture a nickel/graphene hybrid conductive film. The substrate coated with the ink was then dried in a furnace at 150° C.

2-3. Sintering the Nickel/Graphene Hybrid Conductive Film

The conductive film was sintered by irradiating the substrate including the nickel/graphene hybrid conductive film prepared in step 2-2 with a microwave of 1.8 kW for 14 ms.

Comparative Example 1

3-1. Preparing a Copper Ink 5 g of copper particle powder was added to 4 M of hydrochloric acid (HCl) and stirred for 10 minutes to remove a surface oxide film. Thereafter, filtration and washing were performed and an ink was prepared by dispersing the copper particle in DMF. In addition, ethyl cellulose and terpineol were added and stirred in order to obtain a high viscosity ink.

3-2. Manufacturing a Copper Conductive Film

The high viscosity ink prepared in step 3-1 was printed on an upper surface of a polyimide insulating film substrate by screen printing method to manufacture a copper conductive film. The substrate coated with the ink was then dried in a furnace at 150°.

3-3. Sintering the Copper Conductive Film

The conductive film was sintered by irradiating onto the substrate including the copper conductive film prepared in step 3-2 with a microwave of 1.8 kW for 5 ms.

Comparative Example 2

4-1. Preparing a Nickel Ink 5 g of nickel particle powder was added to 4 M of hydrochloric acid (HCl) and stirred for 10 minutes to remove a surface oxide film. Thereafter, filtration and washing were performed and an ink was prepared by dispersing the nickel particle in DMF. In addition, ethyl cellulose and terpineol were added and stirred in order to obtain a high viscosity ink.

4-2. Manufacturing a Nickel Conductive Film

The high viscosity ink prepared in step 4-1 was printed on an upper surface of a polyimide insulating film substrate by screen printing method to manufacture a nickel conductive film. The substrate coated with the ink was then dried in a furnace at 150°.

4-3. Sintering the Nickel Conductive Film

The conductive film was sintered by irradiating onto the substrate including the nickel conductive film prepared in step 4-2 with a microwave of 1.8 kW for 5 ms.

Figure 3:
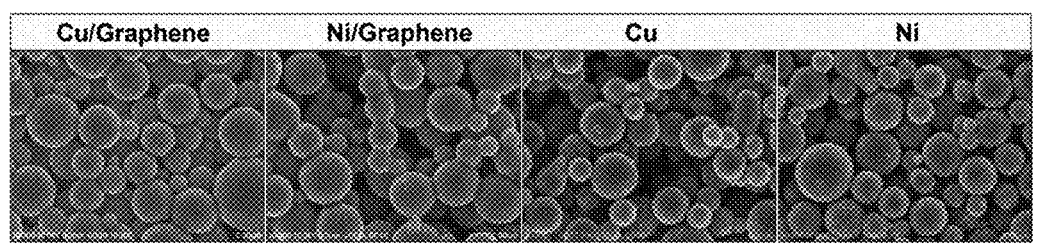
FIG. 3 is a scanning electron microscope image showing samples manufactured in examples and comparative examples after a rapid air-sintering.

FIG. 3 is a scanning electron microscope image showing samples manufactured in Examples and Comparative Examples after rapid air-sintering. It is shown that particles of Example 1 (Cu/Graphene) and Example 2 (Ni/Graphene) were not oxidized after rapid air-sintering, but particle surfaces of Comparative Example 1 (Cu) and Comparative Example 2 (Ni) were oxidized after rapid air-sintering.

Figure 4:
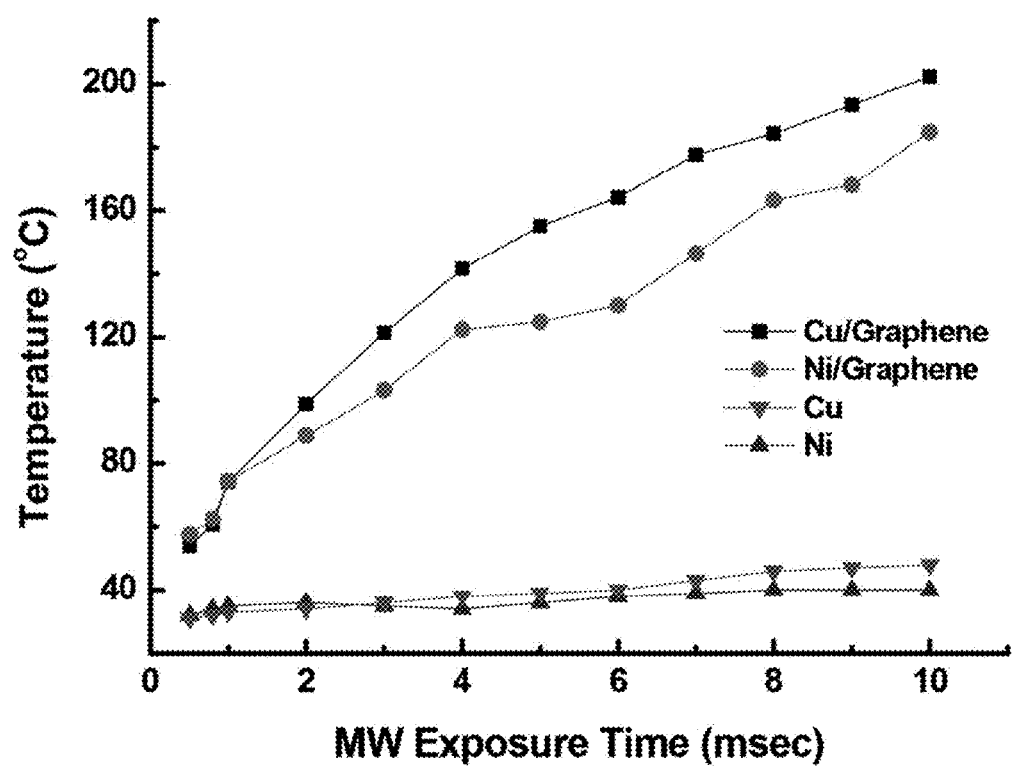
FIG. 4 is a graph showing temperature changes of samples manufactured in examples and comparative examples as a function of light energy irradiating time.

FIG. 4 is a graph showing temperature changes of the samples manufactured in Examples and Comparative Examples as a function of light energy irradiating time. Since Comparative Example 1 and Comparative Example 2 had no two-dimensional nanomaterial on the surface of the metal, light could not be absorbed, therefore, the temperatures thereof were not increased. On the other hand, in Example 1 and Example 2, the two-dimensional nanomaterial absorbed light, so the temperatures thereof increased rapidly.

Figure 5:
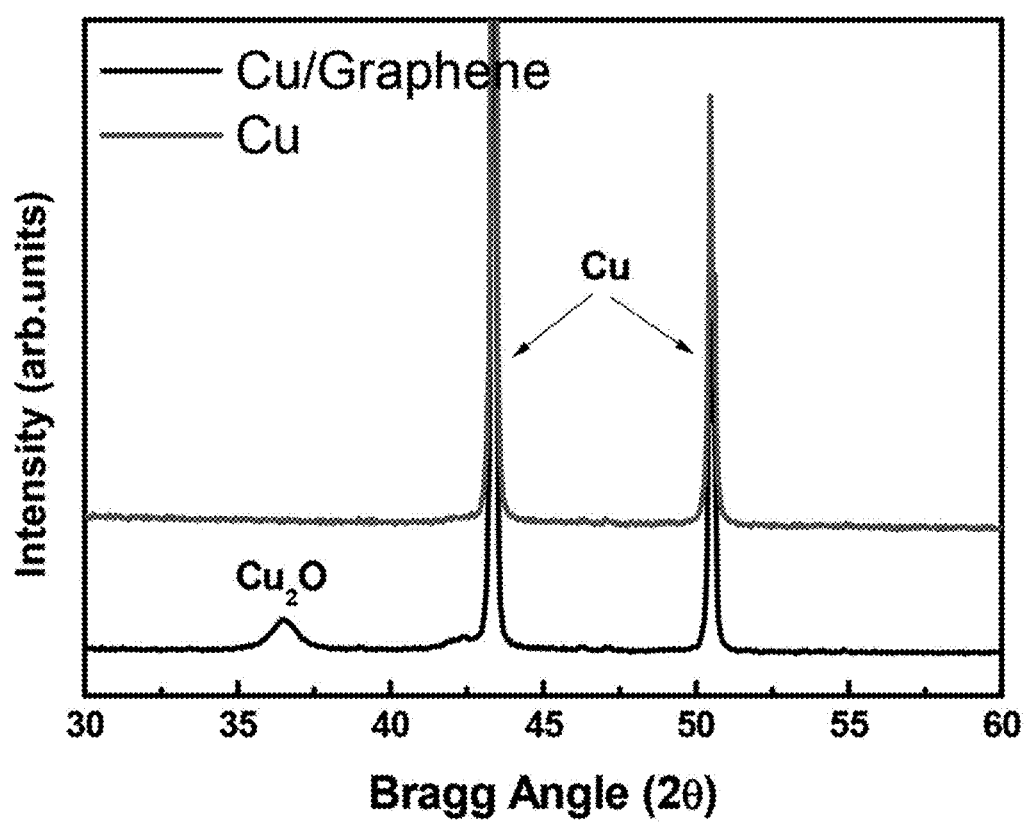
FIG. 5 is an X-ray diffraction spectrum showing a surface oxidation state after rapid air-sintering of samples manufactured in an example and comparative example.

FIG. 5 is an X-ray diffraction spectrum showing a surface oxidation state after rapid air-sintering the samples manufactured in Example 1 and Comparative Example 1. As shown in the spectrum, a copper oxide ($CuO_2$) peak was not shown in Example 1 where the graphene, which is the two-dimensional nanomaterial, was synthesized on an outer surface, but a copper oxide peak of rapid air-sintered copper particles only was shown.

Figure 6:
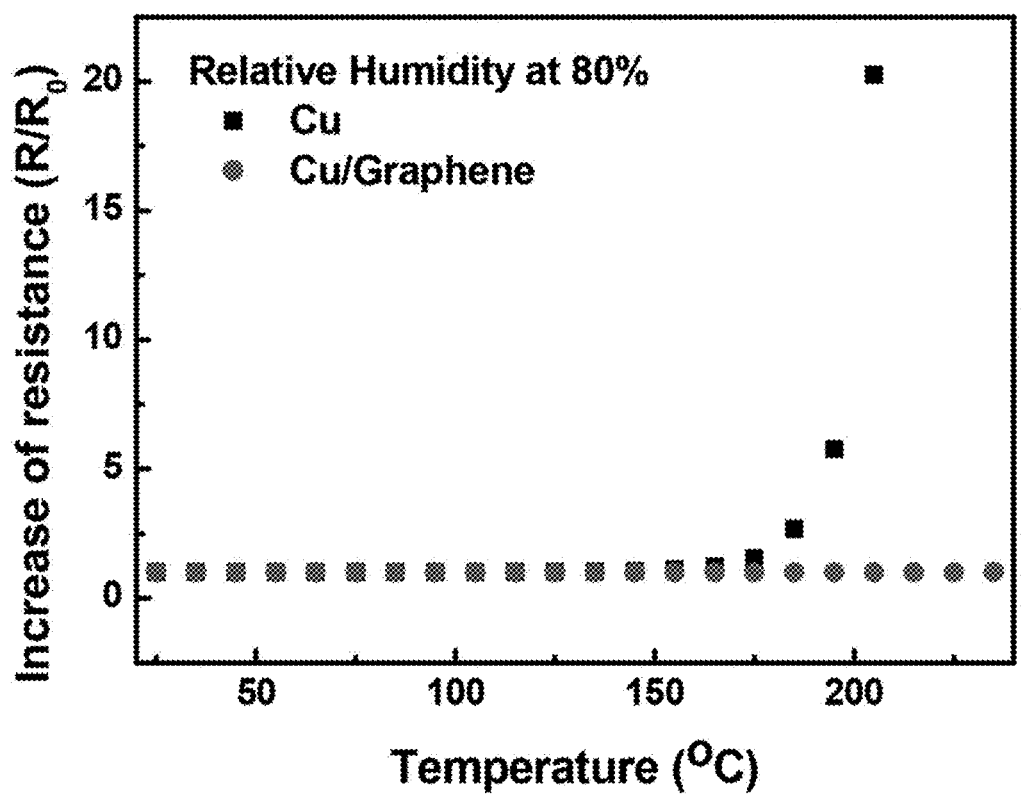
FIG. 6 is a graph showing resistance changes of samples manufactured in an example and comparative example and rapid air-sintered as a function of temperature.

FIG. 6 is a graph showing resistance changes of samples manufactured in Example 1 and Comparative 1 and rapid air-sintered as a function of temperature at 80% relative humidity. Resistance of Example 1 merely changed as temperature was increased, but resistance of Comparative Example 1 changed rapidly as temperature was increased.

Figure 7:
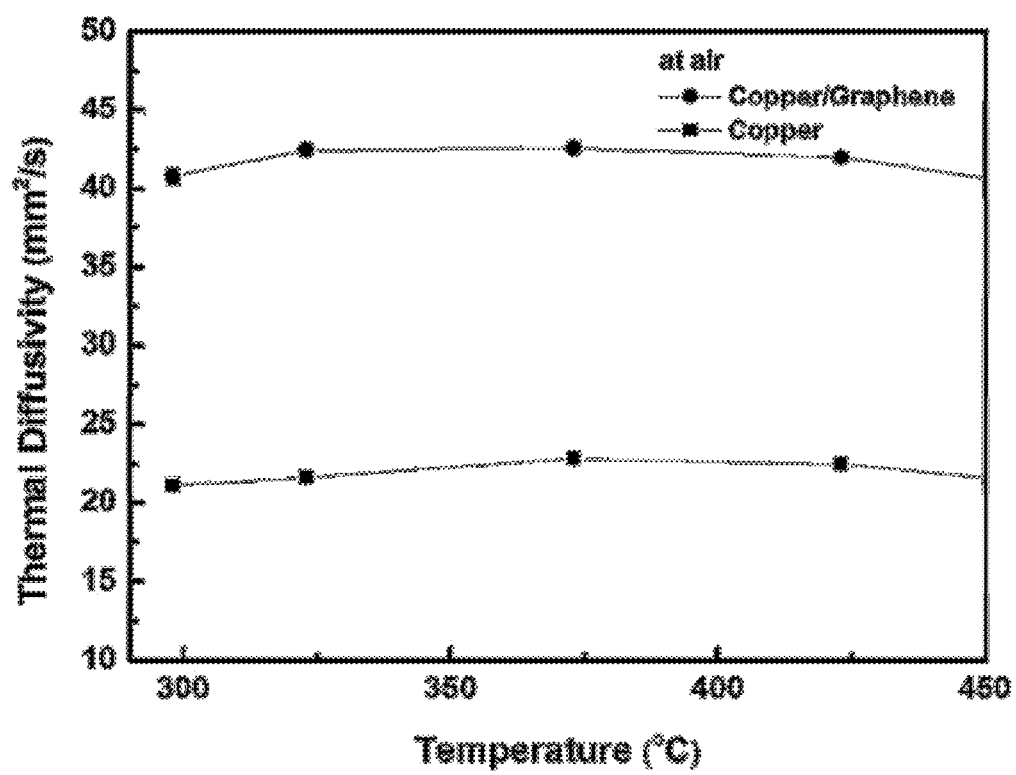
FIGS. 7 and 8 are graphs showing thermal diffusivity of the samples manufactured in an example and comparative example as a function of temperature under air and argon atmosphere, respectively.
Figure 8:
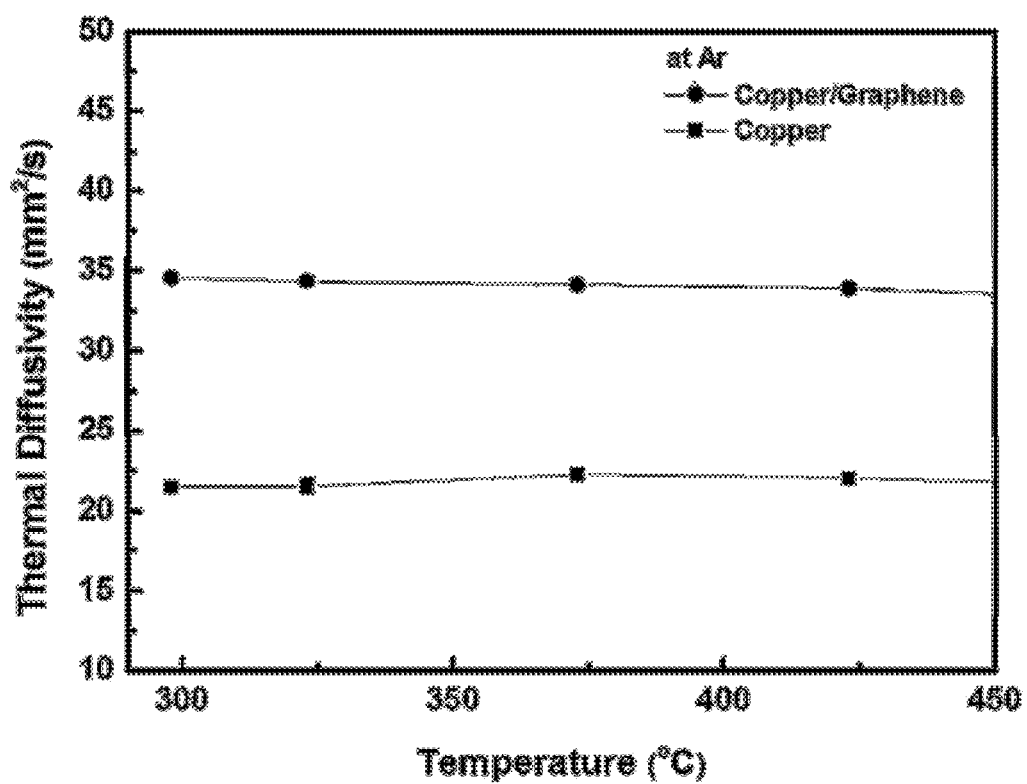

FIGS. 7 and 8 are graphs showing thermal diffusivity of the samples manufactured in Example 1 (Copper/Graphene) and Comparative Example 1 (Copper) as a function of temperature. In detail, FIG. 7 is a graph showing thermal diffusivity in an air atmosphere and FIG. 8 is a graph showing thermal diffusivity in an argon (Ar) atmosphere. As shown in graphs, the conductive film manufactured by using the copper with graphene had high thermal diffusivity compared with the conductive film manufactured by using the copper particles only, regardless of the gas atmosphere. This is because the copper existing inside the graphene was not oxidized, thereby maintaining the thermal conductivity of the copper, and also the graphene having high thermal conductivity surrounds the copper, so the conductive film of Example 1 had much higher thermal conductivity than the conductive film of Comparative Example 1.

Figure 9:
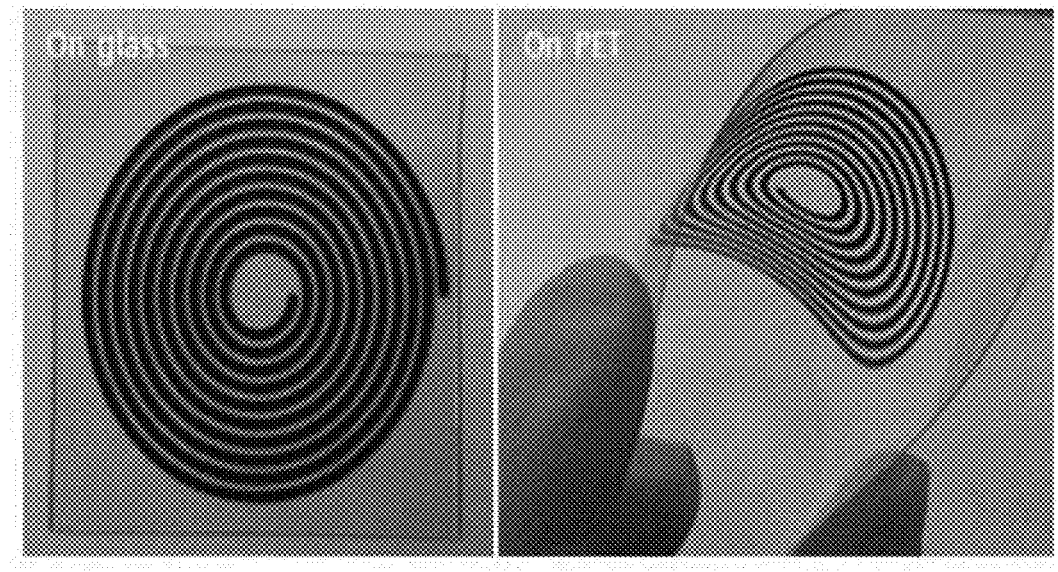
FIG. 9 is a photograph showing a conductive film obtained by patterning a sample of an example on each of a glass substrate and a plastic substrate.

FIG. 9 is a photograph of conductive films obtained by patterning samples obtained from Example on a glass substrate and a plastic substrate, respectively. As shown in the photograph, the conductive film was not damaged at the patterning and the sintering steps and capable of being applied to a flexible plastic substrate easily.

In a related art, in order to prevent metal oxidation during sintering process, a conductive film is manufactured by sintering in an inert gas atmosphere or a vacuum atmosphere, or forming a protective film on the metal and then sintering. Manufacturing process is complicated and manufacturing cost is increased when using such methods. However, to obtain the conductive film in the present invention, the two-dimensional nanomaterial is synthesized on the outer wall of the metal, the ink including the synthesized two-dimensional nanomaterial is applied on the substrate and then the substrate is sintered rapidly by using high-energy light. Therefore, the high conductive two-dimensional nanomaterial is disposed on the outer wall of the metal, thereby preventing metal oxidation although processed in the atmosphere, not an inert gas atmosphere or a vacuum atmosphere.

The present invention relates to the metal/two-dimensional nanomaterial hybrid conductive film and the method for manufacturing the same. More particularly, the present invention is available to be applied to a field of the metal/two-dimensional nanomaterial hybrid conductive film and the method for manufacturing the same, in which the two-dimensional nanomaterial is synthesized on the outer wall of the non-noble metal having high oxidative characteristics, thereby preventing the oxidation of the metal by air and increasing the thermal conductivity and electrical conductivity.

What is claimed is:

1. A method for manufacturing a metal/two-dimensional nanomaterial hybrid conductive film for preventing metal oxidizing, the method comprising:
    preparing a mixture liquid in which a catalytic metal is dispersed in a precursor or a precursor compound of a two-dimensional nanomaterial;
    forming a catalytic metal/two-dimensional nanomaterial by irradiating ultrasonic waves onto the mixture liquid to generate microbubbles, degrading the precursor compound using energy generated when the microbubbles burst to synthesize the two-dimensional nanomaterial on an outer wall of a center core region comprising the catalytic metal, the formed catalytic metal/two-dimensional nanomaterial comprising hybrid particles in which the catalytic metal is surrounded by the two-dimensional nanomaterial;
    dispersing the formed catalytic metal/two-dimensional nanomaterial in a dispersant to prepare an ink; and
    applying the ink on a substrate to form a conductive film and sintering the conductive film rapidly in the atmosphere.

2. The method of claim 1, wherein the sintering the conductive film rapidly in the atmosphere is conducted by irradiating the substrate with high-energy light in the atmosphere.

3. The method of claim 1, wherein the applying the ink on the substrate to form the conductive film and sintering the conductive film rapidly in the atmosphere is conducted by coating, patterning, extruding, blasting, spreading, or printing.

4. The method of claim 1, wherein the ultrasonic waves are generated by an electric power in a range of 100 W to 300 W.

5. The method of claim 2, wherein the sintering the conductive film rapidly in the atmosphere is conducted by irradiating the substrate with light for 0.1 to ms 50 ms.

6. A metal/two-dimensional nanomaterial hybrid conductive film for preventing metal oxidizing comprises:
    a substrate; and
    a hybrid particle layer formed on the substrate, the hybrid particle layer being made of a two-dimensional nanomaterial and surrounding a catalytic metal, which is a core, and an outer wall of the catalytic metal to form a shell shape,
    wherein the two-dimensional nanomaterial is formed on an outer wall of a center core region comprising the catalytic metal, the formed catalytic metal/two-dimensional nanomaterial comprising hybrid particles in which the catalytic metal is surrounded by the two-dimensional nanomaterial.

7. The conductive film of claim 6, wherein the hybrid particle layer is sintered rapidly in the atmosphere by irradiating the hybrid particle layer with high-energy light.

8. The conductive film of claim 6, wherein the two-dimensional nanomaterial is selected from the group consisting of graphene, hexagonal boron nitride (h-Boron nitride), transition metal chalcogenide, and a mixture thereof.

9. The conductive film of claim 6, wherein the catalytic metal is selected from the group consisting of copper (Cu), nickel (Ni), cobalt (Co), iron (Fe), chromium (Cr), tungsten (W), platinum (Pt), palladium (Pd), aluminum (Al), which are non-noble metals, and an alloy thereof.

10. The conductive film of claim 6, wherein the hybrid particle layer is formed by a method that the two-dimensional nanomaterial is synthesized on the outer wall of the catalytic metal by using a mixture liquid in which the catalytic metal is dispersed in a precursor or a precursor compound of the two-dimensional nanomaterial, and the catalytic metal is oxidized.

11. The conductive film of claim 7, wherein the two-dimensional nanomaterial comprises a material absorbing light and dissipating heat.

12. The conductive film of claim 8, wherein the transition metal chalcogenide is expressed as $MX_2$, where M is one selected from the group consisting of titanium (Ti), vanadium (V), zirconium (Zr), niobium (Nb), molybdenum (Mo), technetium (Tc), hafnium (Hf), tantalum (Ta), tungsten (W), and rhenium (Re), and X is one selected from the group consisting of sulfur (S), selenium (Se), and tellurium (Te).

13. The conductive film of claim 10, wherein the hybrid particle layer is formed by a method where the mixture liquid is irradiated with ultrasonic waves to generate microbubbles and the precursor compound is degraded by using an energy generated when the microbubbles burst to synthesize the two-dimensional nanomaterial on the outer wall of the catalytic metal.

* * * * *